United States Patent
Li

(10) Patent No.: US 11,127,436 B2
(45) Date of Patent: Sep. 21, 2021

(54) MEMORY ARRAY WITH ACCESS LINE CONTROL HAVING A SHUNT SENSE LINE

(71) Applicant: Micron Technology, Inc., Boise, ID (US)

(72) Inventor: Jiyun Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 35 days.

(21) Appl. No.: 16/710,687

(22) Filed: Dec. 11, 2019

(65) Prior Publication Data

US 2021/0183411 A1 Jun. 17, 2021

(51) Int. Cl.
*G11C 5/06* (2006.01)
*G11C 8/08* (2006.01)

(52) U.S. Cl.
CPC .............. *G11C 5/063* (2013.01); *G11C 8/08* (2013.01)

(58) Field of Classification Search
CPC ........... G11C 5/063; G11C 8/08; G11C 11/22; G11C 11/221
USPC ........ 365/63, 149, 230.06, 189.01, 205, 208
See application file for complete search history.

(56) References Cited

U.S. PATENT DOCUMENTS

| | | | | |
|---|---|---|---|---|
| 5,880,989 | A | * | 3/1999 | Wilson .................... G11C 11/22 365/145 |
| 6,028,783 | A | * | 2/2000 | Allen ....................... G11C 11/22 365/145 |
| 7,662,693 | B2 | | 2/2010 | Bhattacharyya |
| 7,875,529 | B2 | | 1/2011 | Forbes et al. |
| 8,274,777 | B2 | | 9/2012 | Kiehlbauch |
| 2009/0168502 | A1 | * | 7/2009 | Okayama .............. H01L 27/228 365/158 |
| 2010/0118581 | A1 | * | 5/2010 | Okayama ................ G11C 11/16 365/51 |

* cited by examiner

*Primary Examiner* — Connie C Yoha
(74) *Attorney, Agent, or Firm* — Brooks, Cameron & Huebsch, PLLC

(57) ABSTRACT

An example apparatus includes an array of memory cells. Each memory cell includes an access device. Each access device includes a first source/drain region, a second source/drain region, and a gate opposing a channel connecting the first source/drain region and the second source/drain region. Each access device further includes a storage node. The example apparatus further includes a plurality of sense lines coupled to the first source/drain region of a different respective memory cell of the array of memory cells. The example apparatus further includes a plurality of access lines, wherein each access line includes at least one conductive pathway formed between the access line and a source/drain region of an access device coupled to the access line. The example apparatus further includes a shunt sense line coupled to the additional access device where the conductive pathway is formed.

19 Claims, 7 Drawing Sheets

MEMORY ARRAY WITH ACCESS LINE CONTROL HAVING A SHUNT SENSE LINE

TECHNICAL FIELD

The present disclosure relates generally to semiconductor devices and methods, and more particularly to a memory array with access line control.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
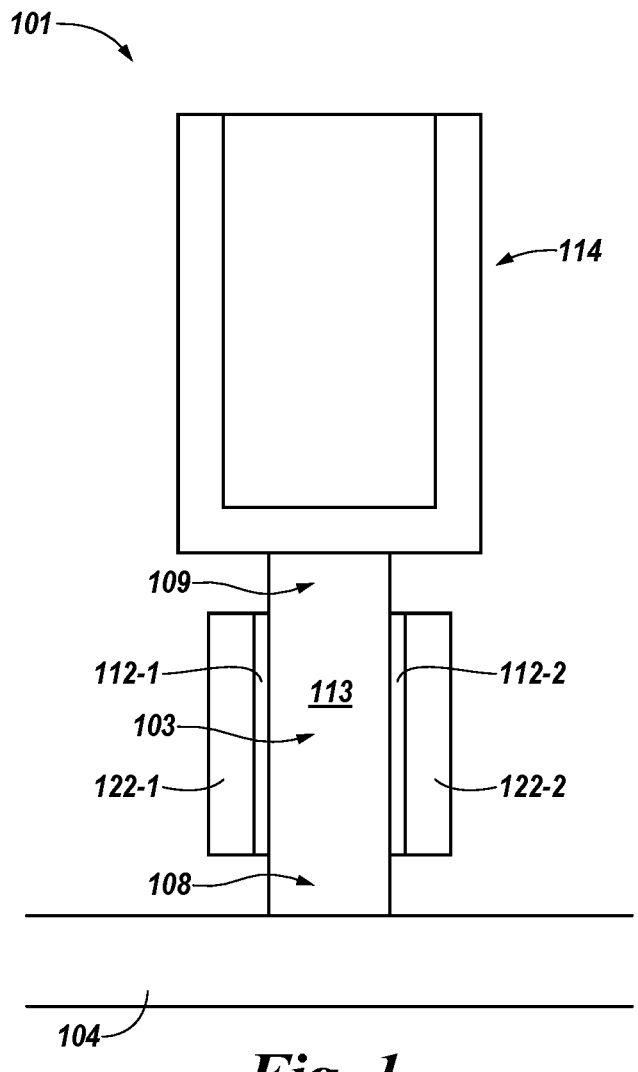
FIG. 1 illustrates an example cross-sectional view of a memory cell of an apparatus in accordance with a number of embodiments of the present disclosure.

Various types of memory devices, including arrays of volatile and/or non-volatile memory cells (e.g., a memory array) are disclosed, where access devices are formed at the intersections of access lines and sense lines. An access device on a sense line may be shorted to create a diode that can decrease the pre-charge response time of an access line.

As used herein, the term "short" may refer to creating a low-resistance path for electric current to allow it to flow to another point in the circuit. With shrinking design rules and increased aspect ratios, less space may be available to add semiconductor structures to a memory array. As such a configuration to decrease the pre-charge response time of an access line without adding drivers to the memory array may be beneficial. Further, decreasing the pre-charge response time of an access line may allow an access line to turn off faster. The faster turn down of an access line may increase the performance of the memory cell. Example embodiments herein disclose a configuration for decreasing the pre-charge response time of an access line without adding an additional driver.

Decreasing the pre-charge response time of an access line in accordance with embodiments of the present disclosure may include coupling a shunt sense line to an access line. As used herein, the term "shunt sense line" may refer to a sense line to which no memory cells are coupled. For example, a conductive pathway may be formed on the shunt sense line, between the access line and a source/drain region of an access device coupled to the shunt sense line. This may allow the voltage across the access line to be pulled down based on (e.g., with) the voltage across the shunt sense line. Pulling the voltage across the access line down with the voltage across the shunt sense line may allow the access line to turn off faster than if the shunt sense line was not coupled to the access line.

Shorting the access device on the shunt sense line may create a diode and allow the shunt sense line to pull the voltage across the access line down to the voltage level of the shunt sense line. For example, a metal oxide semiconductor (MOS) diode may connect the access line and the shunt sense line. When the MOS diode is open, the current of the access line may not affect the voltage across the shunt sense line. However, when the MOS diode is closed, the current of the access line may be provided to the shunt sense line. This may decrease the voltage across the access line and turn the access line off.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something may refer to one or more such things. For example, a number of pillars lines may refer to at least one pillar.

FIG. 1 illustrates a cross-sectional view of a memory cell of an apparatus 101 having a storage node 114, a transistor 113 (also referred to as an access device), access lines 122-1, 122-2 (individually or collectively referred to as access lines 122), and a sense line 104. In some embodiments, the apparatus 101 may be a three-dimensional (3D) DRAM memory cell. In some embodiments, the transistor 113 may be a vertical thin film transistor (TFT) serving as an access device to a memory cell.

The transistor 113 may be a n-channel or p-channel transistor. The transistor 113 may include source/drain regions 108, 109 and a channel 103. The transistor 113 may be configured to electrically couple multiple semiconductor structures. For example, the transistor 113 may be configured to couple the storage node 114 and the sense line 104.

In some embodiments, a source/drain region 108 may be coupled to the sense line 104 and the source/drain region 109 may be coupled to the storage node 114.

In some embodiments, the storage node 114 may be a capacitor. For example, the storage node 114 may include two electrical conductors (e.g., electrical plates) separated by a dielectric material, as well as a grounding plate. For ease of illustration, the two electrical conductors, dielectric material, and grounding plate are not illustrated in the drawings. In some embodiments, coupling the transistor 113 to the storage node 114 may create a one transistor one capacitor (1T1C) memory cell.

The access lines 122 may also be referred to as select lines or word lines. Dielectric materials 112-1, 112-2 (individually or collectively referred to as dielectric materials 112) may separate the transistor 113 and the access lines 122. In some embodiments, the dielectric materials 112-1, 112-2 may be the same dielectric material. In some embodiments, the dielectric materials 112-1, 112-2 may be different dielectric materials. In some embodiments, the apparatuses and methods for reducing the formation of air gaps above access lines 122 may occur in any area of a memory device where there is a benefit to reducing unintended communication between neighboring conductive lines. The access lines 122 may be running perpendicular to a plane of the drawing sheet, e.g., coming out of the page. Further, the access lines 122 may run orthogonal to the sense line 104. In the example illustration of FIG. 1, the illustrated sense line 104 is actually recessed into the page, parallel to the plane of the drawing sheet.

Figure 2:
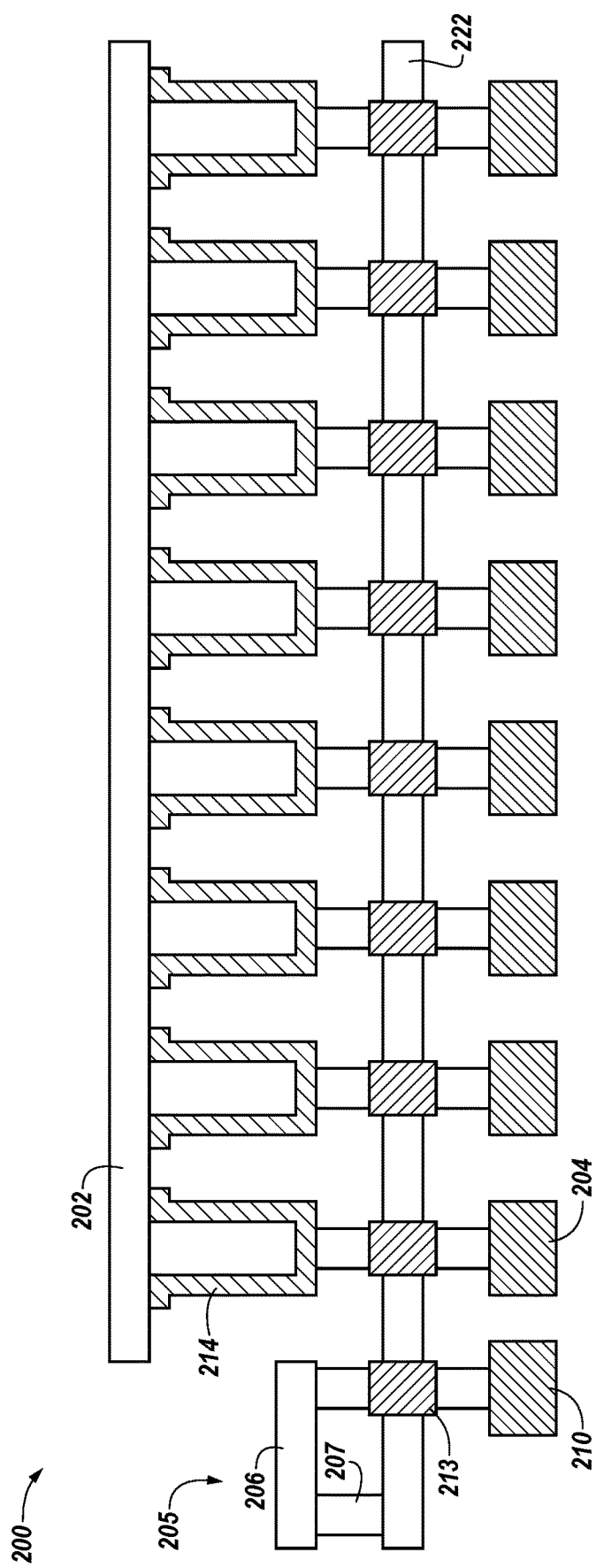
FIG. 2 illustrates an example cross-sectional view of a memory array with access line control in accordance with a number of embodiments of the present disclosure.

FIG. 2 illustrates an example cross-sectional view of a memory array 200 with access line control in accordance with a number of embodiments of the present disclosure. The memory array 200 may include a capacitor plate 202 coupled to a plurality of capacitors 204. Each respective one of the plurality of capacitors 204 may be coupled to a different respective access line 222. A driver may provide voltage across the access lines 222. In some embodiments, the driver may supply a high logic voltage to the access lines 222.

As used herein, the term "high" logic voltage may refer to a voltage corresponding to a particular (e.g., high) logic level. A logic level is a state that a digital signal can possess. The logic level refers to binary logic in which the logic level can be either logic 1 (high state) or logic 0 (low state). In some circuits, the high logic voltage may be five volts (V) and the low logic voltage may be a ground voltage.

Each respective access line 222 may be coupled to a different respective sense line 204. In some embodiments, one of the sense lines may be a shunt sense line 210. The shunt sense line 210 may not be coupled to any of the plurality of capacitors 214. Instead, a conductive pathway 205 may be formed between the access line 222 and a source/drain region of an access device (e.g., vertical TFT) 213 coupled to the access line 222, and the shunt sense line 210 may be coupled to the access device 213 where the conductive pathway 205 is formed. The conductive pathway 205 may be formed by using a connector 206 to couple a contact 207 to the access device 213. In some embodiments both the connector 206 and the contact 207 may be formed from metal materials. This may allow the voltage across the access line 222 to be affected by the current provided to the shunt sense line 210. In some embodiments, the shunt sense line 210 may have a low logic voltage applied thereto. As used herein, a "low" logic voltage may refer to a voltage corresponding to logic level 0. In some embodiments, the low logic voltage may be a ground voltage. In some embodiments, the ground voltage may be less than zero volts (V). The voltage across the shunt sense line 210 may pull the voltage across the access line 222 down. Pulling the voltage across the access line 222 down may cause the voltage across the access line 222 to match the voltage across the shunt sense line 210. This may turn the access line 222 off faster than if the voltage across the access line 222 was not pulled down by the shunt sense line 210. If the access line 222 is not turned off by using the shunt sense line 210 to pull its voltage down, the access line may turn off when a driver provides a low logic voltage across the access line 222.

In the example illustrated in FIG. 2, the shunt sense line 210 is formed at the end of each respective access line 222. However, embodiments are not so limited. For example, in some embodiments, shunt sense line 210 may be formed in the middle of each respective access line 222 (e.g., between the other sense lines 210).

In some embodiments, a high voltage may be provided across the shunt sense line 210. In some embodiments, the high voltage provided across the shunt sense line 210 may be less than the high voltage provided across the access line 222. For example, the high logic voltage provided across the shunt sense line 210 may be a threshold voltage below the high logic voltage (e.g., the high voltage minus the threshold voltage). The threshold voltage may be lower than the voltage across the access line 222. The threshold voltage may be the minimum amount of voltage that can be applied to a transistor to induce conduction between the source and drain terminals of a transistor. Keeping the shunt sense line 210 voltage at a threshold voltage lower than the voltage of the active access line 222 may keep the access device 213 turned off and reduce leakage between the access line 222 and sense line 204. Compared to applying a high logic voltage to the shunt sense line 210, applying voltage that is a threshold voltage less than a high logic voltage may result in less leakage for the access line 222, faster turn off operation for the access line 222, and lower voltage for better reliability.

The shunt sense line 210 may be provided with a high logic voltage so that its voltage is not pulled up by the access line 222. If the shunt sense line 210 is not provided with a voltage, the voltage across the shunt sense line 210 may be pulled up by the access line 222. If the voltage across the shunt sense line 210 is pulled up by the access line 222, the shunt sense line 210 may experience parasitic capacitance. This may increase the time it takes for the shunt sense line 210 to pull the voltage across the access line 222 down because of the time it may take for the voltage across the shunt sense line 210 to decrease from the pulled up voltage to a low logic voltage. Providing a threshold voltage across the shunt sense line 210 may reduce (e.g., prevent) the access line 222 from pulling up the voltage across the shunt sense line 210 and decrease the pre-charge response time in comparison to allowing the access line 222 to pull up the voltage across the shunt sense line 210. Since the voltage across the shunt sense line 210 may be less than the voltage across the access line 222, it may take less time for the voltage to decrease to a low voltage than it would take for a high voltage to decrease to a low voltage. This may result in the shunt sense line 210 pulling the voltage across the access line 222 down faster when a voltage that is a threshold voltage lower than the high voltage is applied to the shunt sense line 210 than if the access line 222 pulled the voltage across the shunt sense line 210 up. Therefore, applying a voltage lower that is a threshold voltage lower than a high voltage across the shunt sense line 210 may allow the access line 222 to turn off faster than if the voltage across the shunt sense line 210 was pulled up by the access line 222.

Figure 3:
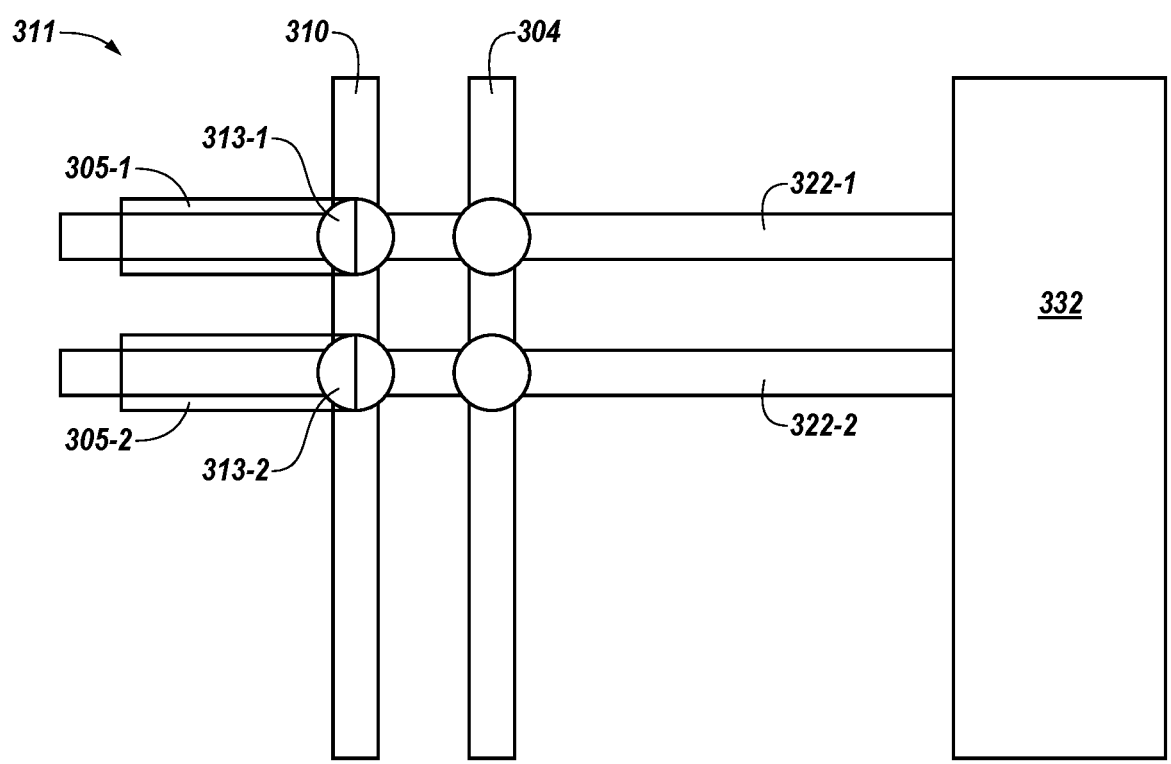
FIG. 3 illustrates an example top-down view of a memory array with access line control in accordance with a number of embodiments of the present disclosure.

FIG. 3 illustrates an example top-down view of a memory array 311 with access line control in accordance with a number of embodiments of the present disclosure. The memory array 311 includes an active access line 322-1 and an inactive access line 322-2 (individually or collectively referred to as access lines 322) connected to a shunt sense line 310 and a sense line 318. Access devices 313-1 and 313-2 (collectively or individually referred to as access device 313) may be formed at the intersections of the shunt sense line 310 and the access lines 322. An access line driver 332 coupled to access lines 322 at the end of each respective access line may provide voltage across the access lines 322. In some embodiments, the access line driver 332 may provide a high voltage across the active access line 322-1 to turn on the active access line 322-1. As used herein, the term "active" access line may refer to an access line receiving a high voltage. As used herein, the term "inactive" access line may refer to an access line that is not receiving high voltage.

A shunt sense line 310 may be coupled to more than one access line 322. As shown in FIG. 3, the shunt sense line 310 may be coupled to the active access line 322-1 and the inactive access line 322-2. In some embodiments, an access device 313 may be coupled to the shunt sense line 310 at each intersection of the shunt sense line 310 and the access lines 322. The access devices 313-1 and 313-2 (individually or collectively referred to as access device 313) may include conductive pathways 305-1 and 305-2 (collectively or individually referred to as conductive pathway 305) formed by shorting an access line 322 to a source/drain region of an access device 313. Forming the conductive pathway 305 may create a diode (e.g., cause the access device 313 to function as a diode).

The access device's 313 behavior may change depending on whether the access device 313 is coupled to a shunt sense line 310 at an intersection of the shunt sense line 310 and an active access line 322-1 or an intersection of the shunt sense line 310 and an inactive access line 322-2. For example, if an access device 313-2 is coupled to a shunt sense line 310 intersecting an inactive access line 322-2, the access device 313-2 may function as a reverse bias diode and prevent current from flowing through the access device 313-2. However, if the access device 313-1 is coupled to a shunt sense line 310 intersecting an active access line 322-1, the access device 313-1 may function as a forward bias diode and allow current to flow through it. This may also pre-charge the active access line 322-1. As used herein, the term "pre-charge" may refer to a process of limiting the amount of current that will flow from a power source to a capacitive component during an initial activation of a circuit. This may protect the circuit components from experiencing stress due to receiving higher levels of currents than they are configured to receive during an initial activation of the circuit. Allowing current to flow from the active access line 322-1 to the shunt sense line 310 may allow the shunt sense line 310 to pull the voltage of the active access line 322-1 down by allowing the current from the active access line 322-1 to flow to the shunt sense line 310 whose low voltage may pull the high voltage of the active access line 322-1 down.

Figure 4:
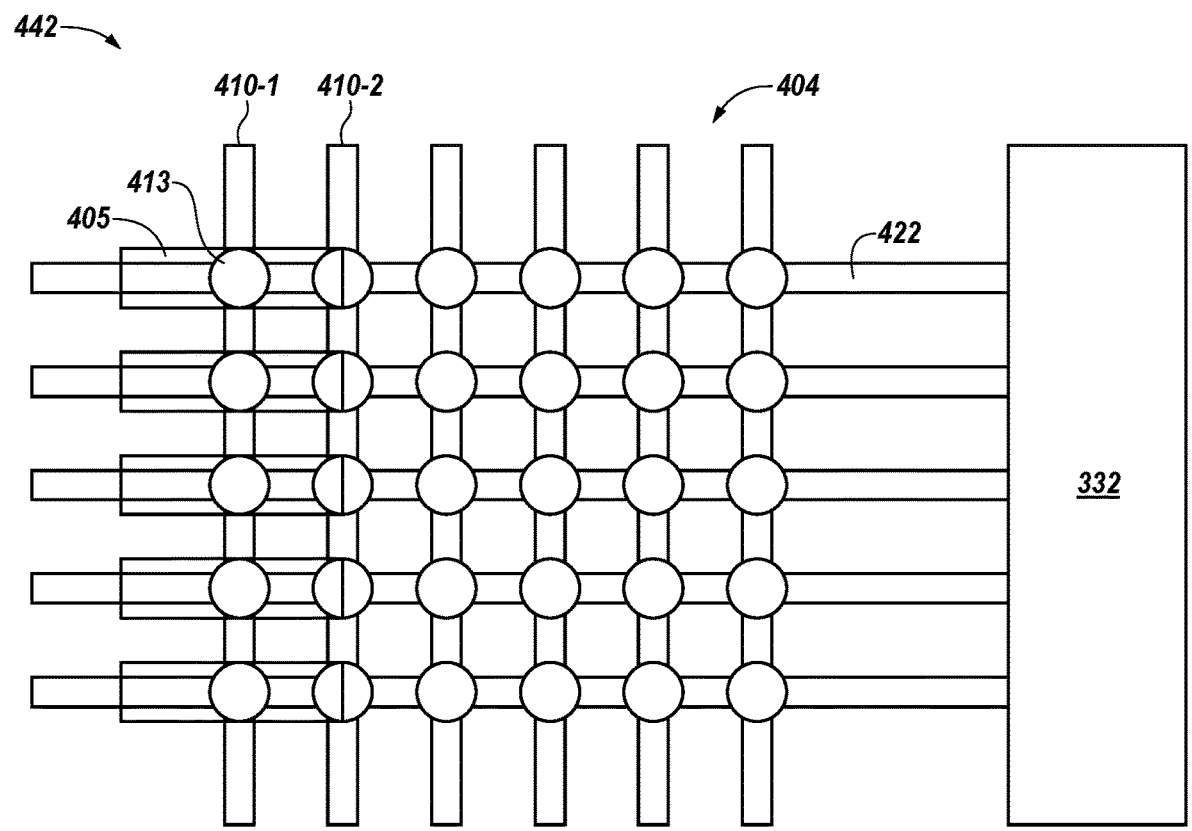
FIG. 4 illustrates another example top-down view of a memory array with access line control in accordance with a number of embodiments of the present disclosure.

FIG. 4 illustrates another example top-down view of a memory array 442 with access line control in accordance with a number of embodiments of the present disclosure. The memory array 442 may include a plurality of access lines 422, a plurality of sense lines 404, and multiple shunt sense lines 410-1 and 410-2 (individually and collectively referred to as shunt sense lines 410). As shown in FIG. 4, the access devices 413 may be coupled to the shunt sense lines 410 at every intersection of the shunt sense lines 410 and the access lines 422. The access devices 413 at each intersection of the shunt sense lines 410 and the access lines 422 may be shorted to form conductive pathways 405 between the access lines 422 and a source/drain region of the access devices 413.

A shorted access device 413 may be coupled to a shunt sense line 410 at every intersection of a shunt sense line 410 and access lines 422 to improve the pre-charge response time of each access line 422. As stated above, the shunt sense lines 410 may pull the access line 422 voltage down to allow the access line 422 to turn off faster. In some embodiments, the access lines 422 may turn off and on sequentially. For example, an access line 422 may be configured to wait until an earlier access line 422 in a sequence of access lines 422 turns off before it turns on. In this example, any delay in an access line 422 turning off may affect any access lines 422 later in the sequence. These delays may compound on each other and cause a decrease in the performance of a memory device. By shorting the access devices 413, the shunt sense lines 410 may pull down the voltage across the access lines 422 and allow the access lines to turn off faster than if the shunt sense lines 410 were not pulling the voltage across the access lines 422 down. This decrease in pre-charge response time may also affect subsequent access lines 422 in a sequence of access lines 422. The decrease in pre-charge response time of each access line 422 may compound on each other and cause an increase in the performance of a memory device.

In some embodiments, multiple shunt sense lines 410 may be coupled to an access line 422. As stated above, each access device 413 may be coupled to the shunt sense line 410 at each intersection of a shunt sense line 410 and an access line 422. Therefore, an access line 422 may be shorted to a source/drain region or cell contact of an access device 413 at multiple locations of the access line 422. As shown in FIG. 4, a conductive pathway 405 may include conductive pathways 405 of multiple access devices 413 on multiple shunt sense lines 410 coupled to one access line 422. Shorting multiple access devices 413 to one access line 422 may provide a benefit to the memory device. For example, shorting multiple access devices 413 to an access line 422 may allow more current to be driven to the access line 422 since more shunt sense lines 410 would be coupled to the access line 422 and, therefore, may be able to drive more current to the access line 422 through the multiple shunt sense lines 410.

Figure 5:
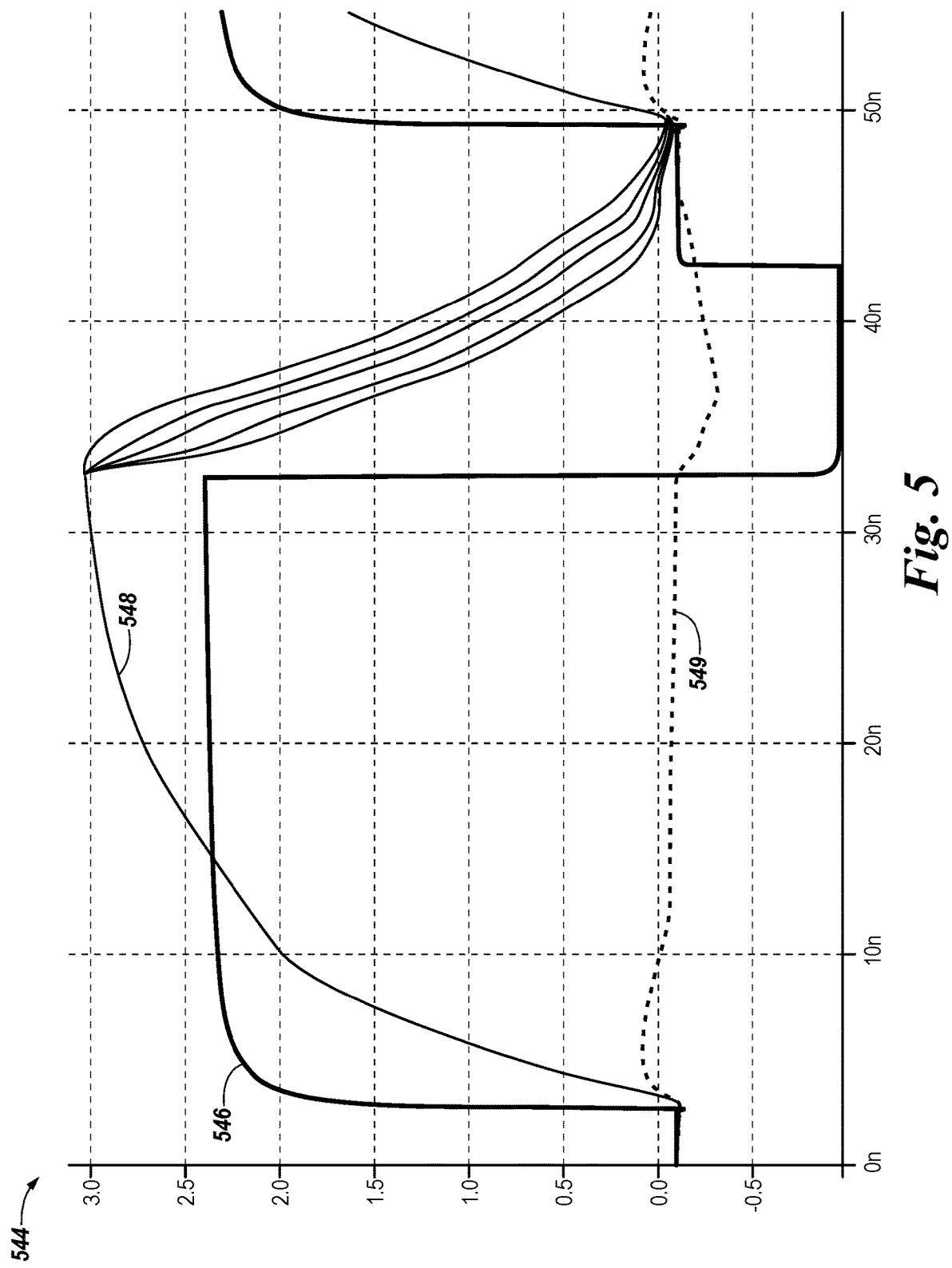
FIG. 5 is an example timing diagram for turning off an access line in accordance with a number of embodiments of the present disclosure.

FIG. 5 illustrates a timing diagram 544 for turning off an access line in accordance with a number of embodiments of the present disclosure. The timing diagram 544 shows the voltage 546 across a shunt sense line and the voltage 548 across an access line coupled to the shunt sense line. As shown in FIG. 5, the voltage 546 applied across the shunt sense line may be less than the voltage 548 applied across the access line. For example, the voltage 546 may be approximately two and a half volts and the voltage 548 may be approximately three volts. The voltage 546 may be the threshold voltage of an access device (e.g. access device 213 in FIG. 2) and the voltage 548 may be a high logic voltage applied to an access line.

As shown in FIG. 5, the voltage 546 may be driven below ground. In some embodiments, the voltage of ground may be approximately 0V. In FIG. 5, at approximately 33 nanoseconds (ns), the voltage 546 may decrease to approximately −1 V. When the voltage 546 decreases, it may pull the voltage 548 down. By decreasing the voltage 546 to below ground, it may pull the voltage 548 down faster than if the voltage 546 was decreased to ground. The difference between the voltage 548 and a voltage below ground voltage is greater than the difference between the voltage 548 and ground voltage. This increased difference in voltage may allow a voltage below ground to pull the voltage 548 down faster than a ground voltage. This may result in a further decrease in the pre-charge response time and improvement in the turn off time for an access line.

At approximately 43 ns, the voltage 546 may increase to ground voltage (e.g., approximately 0V). The voltage 546 may increase to ground voltage to avoid pulling the voltage 548 across the access line down below ground voltage. If the voltage 546 continued to be below ground, then the voltage 548 may have eventually been pulled down to a voltage below ground. By increasing the voltage 546 to ground before the voltage 546 pulls the voltage 548 below ground, the voltage 548 may not be pulled below ground. This process may allow the voltage 546 to pull the voltage 548 down faster than if the voltage 546 was driven to ground throughout the entire process. The voltage 546 may utilize the increased pull down speed of being below ground and then increase its voltage to ground before the voltage 548 reaches ground level. This may result in the voltage 546 pulling the voltage 548 to ground faster than if the voltage 546 was at ground throughout the whole pull down process.

Figure 6:
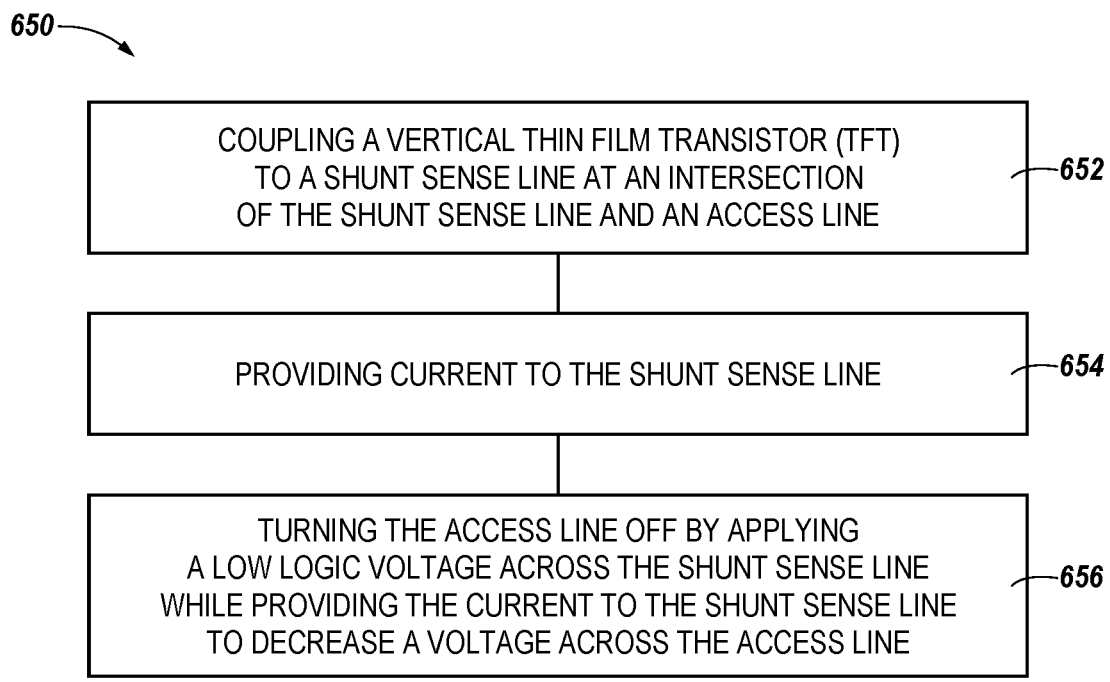
FIG. 6 is a flow diagram of an example method of operating a memory array with access line control in accordance with a number of embodiments of the present disclosure.

FIG. 6 is a flow diagram of an example method 650 of operating a memory array with access line control in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 652, method 650 may include coupling a vertical TFT to a shunt sense line at an intersection of the shunt sense line and an access line. In some embodiments, a diode configuration may be formed by coupling the shunt sense line to a source/drain region of the vertical TFT. In some embodiments, a vertical TFT may be shorted to an access line. Shorting the vertical TFT to an access line may cause the vertical TFT to conduct electricity in one direction and, therefore, function as a diode. In some embodiments, the diode may be a metal oxide semiconductor (MOS) diode. In some embodiments, the sense line may be a shunt sense line. A shunt sense line may be formed to keep the structure of the memory cell consistent. The shunt sense line may not be coupled to a memory cell. This may result in the shunt sense line behaving differently than non-shunt sense lines. For example, in contrast to non-shunt sense lines, the shunt sense line may not be used to locate a cell. Since the shunt sense line may not be connected to a cell, it may not be used to locate a memory cell in a memory array. However, the shunt sense line may be used to control an access line.

At block 654, the method 650 may include providing current to the shunt sense line. As stated above, the sense line may be a shunt sense line. In some embodiments, the memory device in which the shunt sense line is formed may be a DRAM memory device. In a DRAM memory device configuration, the non-shunt sense line may carry a signal from the cell to an outside input/output interface. In contrast, the shunt sense line may be used for a power delivery purpose. For example, the shunt sense line may be used to drive current for an access line. Further, the shunt sense line may be used to control the voltage of an access line.

The DRAM memory device in which the shunt sense line is formed may be a three-dimensional (3D) DRAM or a two-dimensional (2D) DRAM. FIGS. 1-4 represent the structure of memory arrays in a 3D DRAM structure. As shown in FIGS. 1-4, the access lines and sense lines in a 3D DRAM structures may be straight lines. 3D DRAM structures may include semiconductor structures stacked on top of other semiconductor structures in layers. The architecture of having semiconductor structures stacked in layers may allow the access lines and sense lines to be fabricated as straight lines before fabricating other semiconductor structures around the access lines and sense lines. In contrast, the access lines and sense lines in 2D DRAM memory devices may adjust their fabrication paths such that the access lines and sense lines are not straight lines. For example, an access line in a 2D DRAM structure may bend its shape to navigate between multiple sense lines to couple to the intended cell contacts of the sense lines.

At block 656, the method 650 may include turning the access line off by applying a low logic voltage across the shunt sense line while providing the current to the shunt sense line to decrease a voltage across the access line. As stated above, the sense line may be a shunt sense line. The shunt sense line may be coupled to a vertical TFT that is shorted from a gate of the vertical TFT to the access line. This may allow the vertical TFT to act as a diode and allow current to flow from the access line to the shunt sense line. Applying a low logic voltage across the shunt sense line while providing current to the shunt sense line may allow the shunt sense line to pull the voltage across the access line down to a low logic voltage. In some embodiments, the low logic voltage may a ground voltage. In some embodiments, a ground voltage may be less than 0 V. In some embodiments, a voltage that is a threshold voltage lower than a high logic voltage may be applied to the shunt sense line to prevent the voltage of the shunt sense line from being pulled up do to parasitic capacitance.

Using the shunt sense line to pull the voltage of the access line down may decrease the pre-charge response time of the access line and allow the access line to turn off faster than if the shunt sense line did not pull the voltage of the access line down. In some embodiments, the access line may turn off in a range of 1-5 ns faster when pulling down the access line voltage using the shunt sense line. For example, the amount of time to turn the access line off may decrease from 13.5 ns to 10 ns. The benefits of the faster turn off time may compound since each access line in a sequence of access lines may wait for an earlier access line in the sequence to turn off before it turns on. Decreasing each turn off time by 3.5 ns may add up and result in improved performance for a memory device.

Figure 7:
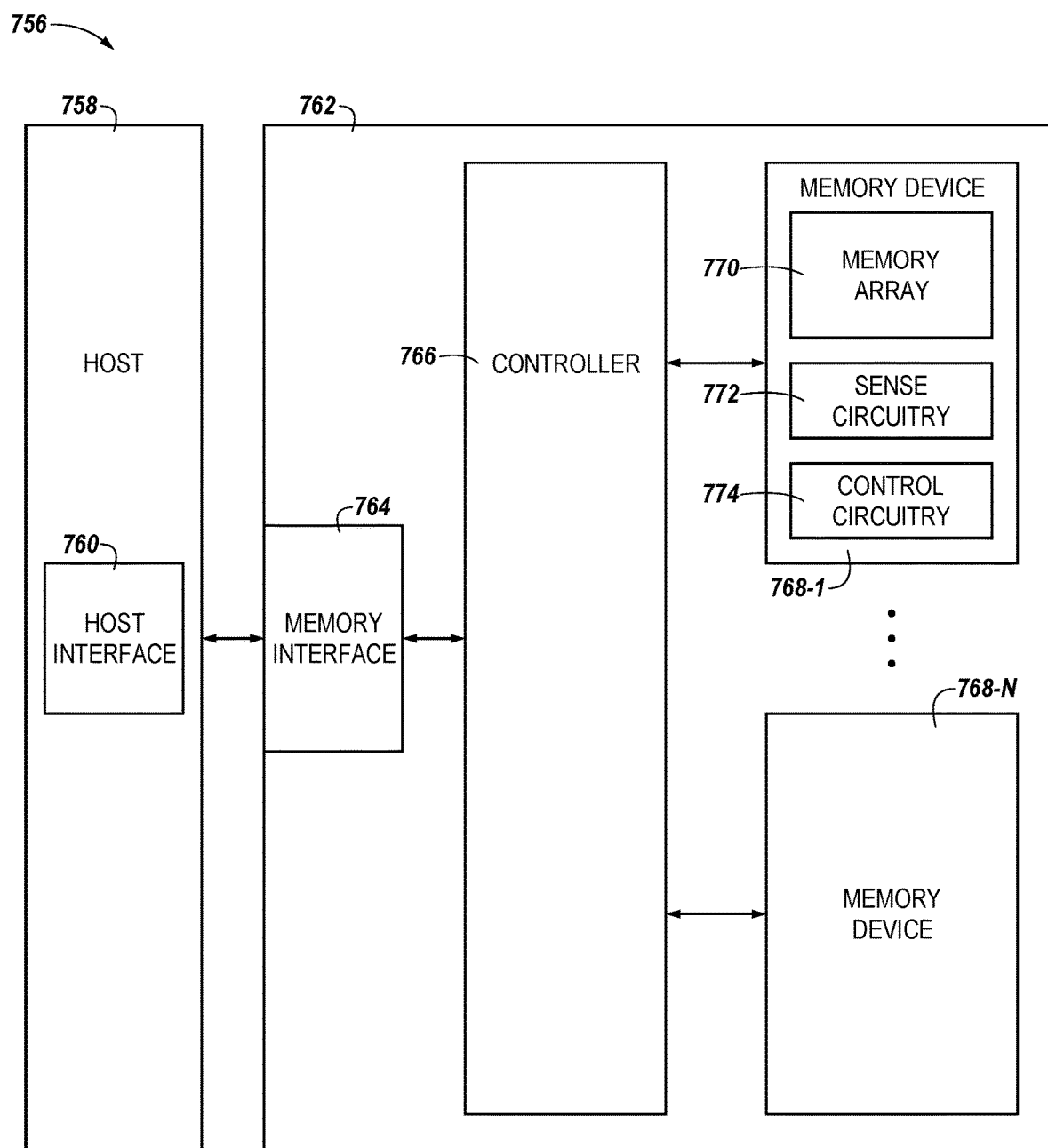
FIG. 7 is a functional block diagram of a computing system including at least one memory array with access line control in accordance with a number of embodiments of the present disclosure.

FIG. 7 is a functional block diagram of a computing system 756 including at least one memory array with access line control in accordance with one or more embodiments of the present disclosure. The numbering convention used in connection with FIG. 7 does not follow the earlier introduced numbering convention and sequence that applies to FIGS. 1-6. Memory system 762 may be, for example, a solid-state drive (SSD).

In the embodiment illustrated in FIG. 7, memory system 762 may include a memory interface 764, a number of memory devices 768-1, ..., 768-N, and a controller 766 selectably coupled to the memory interface 764 and memory devices 768-1, ..., 768-N. Memory interface 764 may be used to communicate information between memory system 762 and another device, such as a host 758. Host 758 may include a processor (not shown). As used herein, "a processor" may be a number of processors, such as a parallel processing system, a number of coprocessors, etc. Example hosts may include, or be implemented in, laptop computers, personal computers, digital cameras, digital recording devices and playback devices, mobile telephones, PDAs, memory card readers, interface hubs, and the like. Such a host 758 may be associated with fabrication operations performed on semiconductor devices and/or SSDs using a processing apparatus.

In a number of embodiments, host 758 may be associated with (e.g., include or be coupled to) a host interface 760. The host interface 760 may enable input of scaled preferences (e.g., in numerically and/or structurally defined gradients) to define, for example, critical dimensions (CDs) of a final structure or intermediary structures of a memory device (e.g., as shown at 768) and/or an array of memory cells (e.g., as shown at 770) formed thereon to be implemented by processing apparatus. The array may include access devices with access line control implemented according to embodiments described herein. The scaled preferences may be provided to the host interface 760 via input of a number of preferences stored by the host 758, input of preferences from another storage system (not shown), and/or input of preferences by a user (e.g., a human operator).

Memory interface 764 may be in the form of a standardized physical interface. For example, when memory system 762 may be used for information (e.g., data) storage in computing system 756, memory interface 764 may be a serial advanced technology attachment (SATA) interface, a peripheral component interconnect express (PCIe) interface, or a universal serial bus (USB) interface, among other physical connectors and/or interfaces. In general, however, memory interface 764 may provide an interface for passing control, address, information, scaled preferences, and/or other signals between the controller 766 of memory system 762 and a host 758 (e.g., via host interface 760).

Controller 766 may include, for example, firmware and/or control circuitry (e.g., hardware). Controller 766 may be operably coupled to and/or included on the same physical device (e.g., a die) as one or more of the memory devices 768-1, . . . , 768-N. For example, controller 766 may be, or may include, an ASIC as hardware operably coupled to circuitry (e.g., a printed circuit board) including memory interface 764 and memory devices 768-1, . . . , 768-N. Alternatively, controller 766 may be included on a separate physical device that is communicatively coupled to the physical device (e.g., the die) that includes one or more of the memory devices 768-1, . . . , 768-N.

Controller 766 may communicate with memory devices 768-1, . . . , 768-N to direct operations to sense (e.g., read), program (e.g., write), and/or erase information, among other functions and/or operations for management of memory cells. Controller 766 may have circuitry that may include a number of integrated circuits and/or discrete components. In a number of embodiments, the circuitry in controller 766 may include control circuitry for controlling access across memory devices 768-1, . . . , 768-N and/or circuitry for providing a translation layer between host 758 and memory system 762.

Memory devices 768-1, . . . , 768-N may include, for example, a number of memory arrays 770 (e.g., arrays of volatile and/or non-volatile memory cells). For instance, memory devices 768-1, . . . , 768-N may include arrays of memory cells, such as a portion of an example memory device structured to include storage node contacts. At least one array may have access line control implemented therein according to the embodiments disclosed herein. As will be appreciated, the memory cells in the memory arrays 770 of memory devices 768-1, . . . , 768-N may be in a RAM architecture (e.g., DRAM, SRAM, SDRAM, FeRAM, MRAM, ReRAM, etc.), a flash architecture (e.g., NAND, NOR, etc.), a 3D RAM and/or flash memory cell architecture, or some other memory array architecture including pillars and adjacent trenches.

Memory device 768 may be formed on the same die. A memory device (e.g., memory device 768-1) may include one or more arrays 770 of memory cells formed on the die. A memory device may include sense circuitry 772 and control circuitry 774 associated with one or more arrays 770 formed on the die, or portions thereof. The sense circuitry 772 may be utilized to determine (sense) a particular data value (e.g., 0 or 1) that is stored at a particular memory cell in a row of an array 770. The control circuitry 774 may be utilized to direct the sense circuitry 772 to sense particular data values, in addition to directing storage, erasure, etc., of data values in response to a command from host 758 and/or host interface 760. The command may be sent directly to the control circuitry 774 via the memory interface 764 or to the control circuitry 774 via the controller 766.

The embodiment illustrated in FIG. 7 may include additional circuitry that is not illustrated so as not to obscure embodiments of the present disclosure. For example, memory device 768 may include address circuitry to latch address signals provided over I/O connectors through I/O circuitry. Address signals may be received and decoded by a row decoder and a column decoder to access a memory array 770. It will be appreciated that the number of address input connectors may depend on the density and/or architecture of memory devices 768 and/or memory arrays 770.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, oxide materials, nitride materials, buffer materials, etch chemistries, etch processes, solvents, memory devices, memory cells, openings, among other materials and/or components related to patterning a material over an active area for a storage node contact, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, oxide materials, nitride materials, buffer materials, etch chemistries, etch processes, solvents, memory devices, memory cells, sidewalls of openings and/or trenches related to patterning a material over an active area for a storage node contact than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
an array of memory cells, each memory cell including:
an access device, wherein the access device comprises a first source/drain region, a second source/drain region, and a gate opposing a channel connecting the first source/drain region and the second source/drain region; and
a storage node;
a plurality of sense lines each coupled to the first source/drain region of a different respective memory cell of the array of memory cells;
a plurality of access lines, wherein each access line comprises at least one conductive pathway formed between the access line and a source/drain region of an additional access device coupled to the access line, wherein the conductive pathway is formed by shorting the access line to the additional access device; and
a shunt sense line coupled to the additional access device where the conductive pathway is formed.

2. The apparatus of claim 1, wherein at least one of the access lines includes multiple conductive pathways formed between the access line and a source/drain region of a different respective additional access device.

3. The apparatus of claim 1, wherein the apparatus includes an access line driver coupled to the plurality of access lines at an end of each respective access line.

4. The apparatus of claim 1, wherein the storage node of each respective memory cell is formed at an intersection of one of the sense lines and one of the access lines.

5. The apparatus of claim 1, wherein the conductive pathway is formed on the shunt sense line.

6. The apparatus of claim 1, wherein the shunt sense line is formed at an end of each respective access line.

7. The apparatus of claim 1, wherein the shunt sense line is formed in the middle of each respective access line.

8. The apparatus of claim 1, wherein the apparatus includes multiple shunt sense lines.

9. The apparatus of claim 1, wherein the additional access device is a vertical thin film transistor (TFT).

10. A method, comprising:
coupling a vertical thin film transistor (TFT) to a shunt sense line at an intersection of the shunt sense line and an access line, wherein coupling the vertical TFT to the shunt sense line comprises shorting a source/drain region of the vertical TFT to the shunt sense line to form a diode configuration;
providing current to the shunt sense line; and
turning the access line off by applying a low logic voltage across the shunt sense line while providing the current to the shunt sense line to decrease a voltage across the access line.

11. The method of claim 10, further comprising using a ground voltage as the low logic voltage.

12. The method of claim 11, further comprising using a voltage that is less than zero volts as the ground voltage.

13. The method of claim 10, further comprising decreasing the voltage across the access line to a voltage that is less than a ground voltage.

14. The method of claim 10, further comprising applying a voltage that is one threshold voltage lower than a high logic voltage to the shunt sense line to prevent the voltage across the shunt sense line from being pulled up.

15. An apparatus, comprising:
a sense line;
an access line coupled orthogonally to the sense line; and
a vertical thin film transistor (TFT) coupled to the sense line at an intersection of the sense line and the access line, wherein:
the vertical TFT is coupled to a conductive pathway formed between the access line and a source/drain region of the vertical TFT; and
the conductive pathway is formed by shorting the access line to the source/drain region of the vertical TFT.

16. The apparatus of claim 15, wherein the vertical TFT is shorted to create a diode.

17. The apparatus of claim 16, wherein the diode is a metal oxide semiconductor (MOS) diode.

18. The apparatus of claim 15, wherein the sense line is a shunt sense line.

19. The apparatus of claim 18, wherein the shunt sense line is not coupled to a memory cell.

* * * * *